(12) United States Patent
Zhu et al.

(10) Patent No.: US 8,803,208 B2
(45) Date of Patent: Aug. 12, 2014

(54) METHOD FOR FABRICATING CONTACT ELECTRODE AND SEMICONDUCTOR DEVICE

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 365 days.

(21) Appl. No.: 13/129,075

(22) PCT Filed: Feb. 24, 2011

(86) PCT No.: PCT/CN2011/071251
§ 371 (c)(1),
(2), (4) Date: May 24, 2011

(87) PCT Pub. No.: WO2012/055197
PCT Pub. Date: May 3, 2012

(65) Prior Publication Data
US 2012/0104466 A1    May 3, 2012

(30) Foreign Application Priority Data
Oct. 29, 2010  (CN) .......................... 2010 1 0531985

(51) Int. Cl.
| | | |
|---|---|---|
| *H01L 29/78* | (2006.01) | |
| *H01L 21/8234* | (2006.01) | |
| *H01L 23/485* | (2006.01) | |
| *H01L 29/66* | (2006.01) | |
| *H01L 29/417* | (2006.01) | |

(52) U.S. Cl.
CPC ........ *H01L 23/485* (2013.01); *H01L 29/66628* (2013.01); *H01L 29/7845* (2013.01); *H01L 29/41775* (2013.01); *H01L 29/7834* (2013.01); *H01L 29/6659* (2013.01)
USPC ................... 257/288; 257/382; 257/E23.011; 257/E21.507; 438/233; 438/300; 438/586

(58) Field of Classification Search
CPC ............ H01L 23/485; H01L 29/41175; H01L 29/66628; H01L 29/7834; H01L 29/6659; H01L 21/76805; H01L 29/41766; H01L 29/41783; H01L 21/823814
USPC .......... 257/288, 367, 379, 382, 383, E23.011, 257/E21.507; 438/198, 233, 300, 586
See application file for complete search history.

(56) References Cited

U.S. PATENT DOCUMENTS

| | | | | |
|---|---|---|---|---|
| 6,462,395 B1 * | 10/2002 | Fukuda et al. | ................ | 257/520 |
| 6,593,217 B1 * | 7/2003 | Fujisawa | ...................... | 438/495 |
| 7,439,142 B2 * | 10/2008 | Samoilov et al. | ............. | 438/300 |
| 7,989,298 B1 * | 8/2011 | Chan et al. | ................... | 438/300 |
| 8,358,012 B2 * | 1/2013 | Haran et al. | .................. | 257/774 |
| 2007/0018252 A1 * | 1/2007 | Zhu | ............................... | 257/369 |
| 2008/0032073 A1 * | 2/2008 | Ushijima et al. | ........... | 428/32.22 |

* cited by examiner

*Primary Examiner* — Tuan N. Quach
(74) *Attorney, Agent, or Firm* — Kinney & Lange, P.A.

(57) ABSTRACT

The invention provides a semiconductor device comprising: a substrate; a gate, which is formed on the substrate; a source and a drain, which are located on opposite sides of the gate, respectively; a contact, which contacts with the source and/or the drain, wherein the contact has an enlarged end at an end which is in contact with the source and/or the drain. In the present invention, since the contact area of the contact is increased on the interface in contact with the source/the drain, the contact resistance can be reduced, and thus the performances of the semiconductor device can be guaranteed/improved. The present invention further provides a method of fabricating the semiconductor device (especially the contact therein) as previously described.

8 Claims, 3 Drawing Sheets

METHOD FOR FABRICATING CONTACT ELECTRODE AND SEMICONDUCTOR DEVICE

CROSS-REFERENCE TO RELATED APPLICATION(S)

The present application is the national phase of PCT Application No. PCT/CN2011/071251 filed Feb. 24, 2011, which in turn claims priority to Chinese Application No. 201010531985.2 filed Oct. 29, 2010.

FIELD OF INVENTION

The present invention relates to the field of semiconductor, and particularly to a method for fabricating a contact, and a semiconductor device containing the contact fabricated by the afore-mentioned method for fabricating a contact.

BACKGROUND

With the continuous scaling of semiconductor devices, the size of a contact for source/drain is shrinking accordingly. In this case, the contact resistance between the contact and the source/drain may have a trend of becoming greater. The increase of the contact resistance will cause a decline of performances of the semiconductor device.

SUMMARY OF THE INVENTION

Considering the above defects in conventional fabrication processes, the present invention provides a method for fabricating a contact, which can reduce the contact resistance by increasing the contact area between the contact and the source/drain. The contact fabricated according to the present invention may have an enlarged end in contact with the source/drain. According to the process characteristics of the present invention, the enlarged end may have a diamondoid cross section. Further, the present invention provides a semiconductor device containing the contact fabricated by the afore-mentioned method for fabricating a contact.

According to a first aspect of the present invention, a semiconductor device is provided. The semiconductor device comprises: a substrate; a gate, which is formed on the substrate; a source and a drain, which are located on opposite sides of the gate, respectively; a contact, which is contacted with the source and/or the drain, wherein the contact has an increased end part on an end of the contact which is contacted with the source and/or the drain.

Preferably, the source includes a source in-situ doped layer formed inside the substrate and a raised source layer on the source in-situ doped layer, and the drain includes a drain in-situ doped layer formed inside the substrate and a raised drain layer on the drain in-situ doped layer.

Preferably, the increased end part of the contact is located on the raised source layer or the raised drain layer.

Preferably, the increased end part of the contact is located on the raised source layer and the source in-situ doped layer; and/or the increased end part of the contact is located on the raised drain layer or the drain in-situ doped layer.

Preferably, the contact is formed by a strain contact material.

Preferably, the substrate is a Si substrate, a crystal face orientation of the Si substrate's surface being <100>, the raised source layer and/or the raised drain layer being formed by growing extendedly along the crystal face orientation <100> of the Si substrate's surface, the increased end part being formed by a wet etching.

Preferably, the substrate is a Si substrate, a crystal face orientation of the Si substrate's surface being <100>, the raised source layer and/or the raised drain layer being formed by growing extendedly along the crystal face orientation <100> of the Si substrate's surface, a sidewall of the increased end part being in parallel with the crystal face {111} of Si crystal.

According to a second aspect of the present invention, a method of fabricating a contact is provided. The method comprises steps of: forming a contact hole on a semiconductor device structure, the semiconductor device structure comprising a gate, a source and a drain, a bottom of the contact hole exposing the source and/or the drain; etching the source and/or the drain exposed at the bottom of the contact hole, so as to form a contact hole whose bottom is increased; and filling the contact hole whose bottom is enlarged with the contact material, in order to form a contact contacted with the source and/or the drain, so that the contact has an increased end part on an end of the contact contacted with the source and/or the drain.

Preferably, the source includes a source in-situ doped layer formed inside the substrate and a raised source layer on the source in-situ doped layer, and the drain includes a drain in-situ doped layer formed inside the substrate and a raised drain layer on the drain in-situ doped layer.

Preferably, in the etching step, only the source in-situ doped layer and/or the drain in-situ doped layer are etched.

Preferably, in the etching step, the source in-situ doped layer and the raised source layer are etched, and/or the drain in-situ doped layer and the raised drain layer are etched.

Preferably, the contact material is a strain contact material.

Preferably, the substrate is a Si substrate, a crystal face orientation of the Si substrate's surface being <100>, the raised source layer and/or the raised drain layer being formed by growing extendedly along the crystal face orientation <100> of the Si substrate's surface, the increased end part being formed by a wet etching.

Preferably, the substrate is a Si substrate, a crystal face orientation of the Si substrate's surface being <100>, the raised source layer and/or the raised drain layer being formed by growing extendedly along the crystal face orientation <100> of the Si substrate's surface, a sidewall of the increased end part being in parallel with the crystal face {111} of Si crystal.

In the present invention, since the contact area on the interface between the contact and the source/drain is increased, the contact resistance can be reduced. Thus, the performances of the semiconductor device can be guaranteed or improved.

BRIEF DESCRIPTION OF THE DRAWINGS

The objects, advantages, and characteristics of the present invention will be more apparent, according to descriptions of preferred embodiments in connection with the drawings, wherein:

FIGS. 1-6 show illustrative diagrams of respective steps in a method for fabricating a contact according to a first embodiment of the present invention, in which FIG. 6 shows a semiconductor device containing the contact fabricated by the method for fabricating the contact according to the first embodiment of the present invention; and FIGS. 1-4, 7, and 8 show illustrative diagrams of respective steps in a method for fabricating a contact according to a second embodiment of the present invention, in which FIG. 8 shows a semiconductor device containing the contact fabricated by the method for fabricating the contact according to the second embodiment of the present invention.

Figure 1:
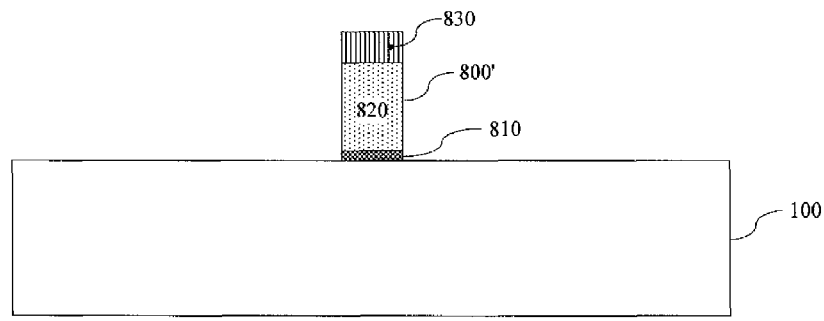

It should be noted that various parts in the drawings are not drawn to scale and they are only for illustrative purposes. Thus, they should not be understood as any limitations or constraints on the scope of the present invention. In respective drawings, similar elements are represented by similar reference numbers.

PREFERRED EMBODIMENTS

Figure 6:
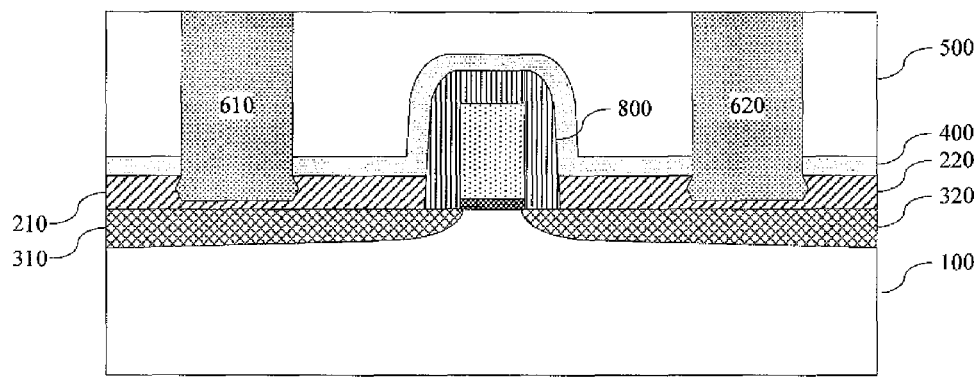

Hereinafter, the present invention will be further described in detail by referring to the drawings and the embodiments in order to make the objects, technical solutions, and advantages of the present invention more apparent. In the description, details and functions which are unnecessary for the present invention are omitted for clarity First Embodiment Firstly, a semiconductor device containing a contact fabricated by a method for fabricating the contact according to a first embodiment of the present invention may be described in detail with reference to FIG. 6. FIG. 6 shows an illustrative diagram of the semiconductor device containing the contact fabricated by the method for fabricating the contact according to the first embodiment of the present invention.

As shown in FIG. 6, the semiconductor device containing the contact fabricated by the method for fabricating the contact according to the first embodiment of the present invention may mainly comprise: a substrate 100 (Si wafer, SOI, etc.); a gate 800 which is formed on the substrate 100; a source (S) and a drain (D), which are located on opposite sides of the gate 800, respectively, wherein the source may include a source in-situ doped layer (n-type or p-type) 310 formed inside the substrate 100 and a raised source layer (n-type or p-type doped Si) 210 on the source in-situ doped layer 310, and the drain may include a drain in-situ doped layer (n-type or p-type) 320 formed inside the substrate 100 and a raised drain layer (n-type or p-type doped Si) 220 on the drain in-situ doped layer 320; a nitride layer 400, which may cover the gate 800, the source and the drain; an oxide layer 500, which may cover the nitride layer 400; a source contact 610, which may extend through the oxide layer 500 and the nitride layer 400 and contact with the raised source layer 210 of the source; and a drain contact 620, which may extend through the oxide layer 500 and the nitride layer 400 and contact with the raised drain layer 220 of the drain, wherein the source contact 610 and the drain contact 620 may have enlarged cross sections (diamondoid cross sections) on respective ends of the source contact 610 and the drain contact 620 in the raised source layer 210 and the raised drain layer 220. In the above solution, the oxide layer 500 and the nitride layer 400 may also be replaced with other dielectric materials well-known to the skilled in the art, which are not limited in the present invention.

In the present invention, since the source contact 610/the drain contact 620 may have enlarged cross section at the end of the source contact 610/the drain contact 620 which is in contact with the source/the drain, the contact area between the source contact 710/the drain contact 720 and the source/the drain can be increased, and the contact resistance can be reduced. Thus, the performances of the semiconductor device can be guaranteed/improved.

Hereinafter, various steps in the method for fabricating the contact according to the first embodiment of the present invention will be described in detail with reference to FIGS. 1-6.

Firstly, the gate stack 800' may be formed on the substrate 100 (Si wafer, SOI, etc. or other substrate structures capable of being applied in the fabrication of a semiconductor device) according to the conventional process, as shown in FIG. 1. Optionally, for the embodiments of the present invention, the substrate 100 may use a Si substrate with the surface having <100> crystal orientation. The gate stack 800 may consist of a gate dielectric layer 810, a gate conductor 820, and a nitride cover layer 830, which are arranged from bottom to top.

Figure 2:
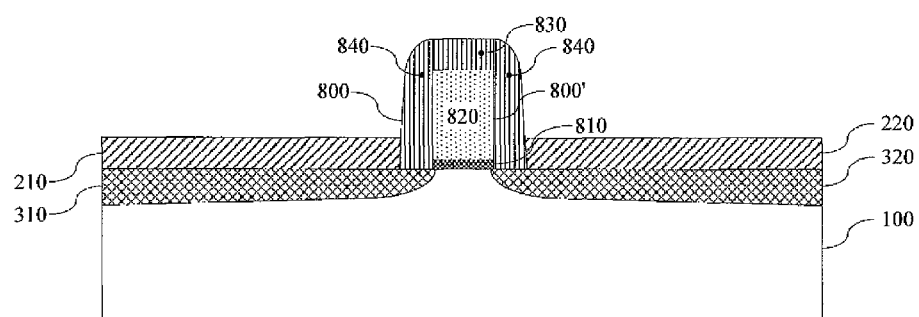

Then, the source in-situ doped layer (n-type or p-type) 310 and the drain in-situ doped layer (n-type or p-type) 320 may be formed inside the substrate 100 and may be annealed to activate the injected ions according to conventional processes, as shown in FIG. 2. Next, a sidewall spacer 840 may be formed surrounding the gate stack 800'. Then, a heavy doping process for source/drain may be further performed, optionally.

Next, the raised source layer (n-type or p-type doped Si) 210 and the raised drain layer (n-type or p-type doped Si) 220 may be formed on the source in-situ doped layer 310 and the drain in-situ doped layer 320, so as to form the source and the drain of the semiconductor device. For example, the raised source layer 210 and the raised drain layer 220 may be semiconductor layers different from the substrate 100. Preferably, for embodiments of the present invention, the raised source layer 210 and the raised drain layer 220 may be formed by epitaxial growth of Si or doped Si along the crystal orientation <100> of the Si substrate 100 whose surface has the crystal face orientation <100>. For example, the above structure may be formed using the conventional extension implantation and annealing processes.

Hereinafter, descriptions on the detailed structures (810, 820, 830, 840, 800') of the gate 800 are omitted for convenience and clarity. There are many processes capable of forming the gate 800 as illustrated above. Additionally, the gate 800 is not limited to the structure shown in the drawings. Other structures of the gate 800 obtained using conventional processes may also be possible.

Figure 3:
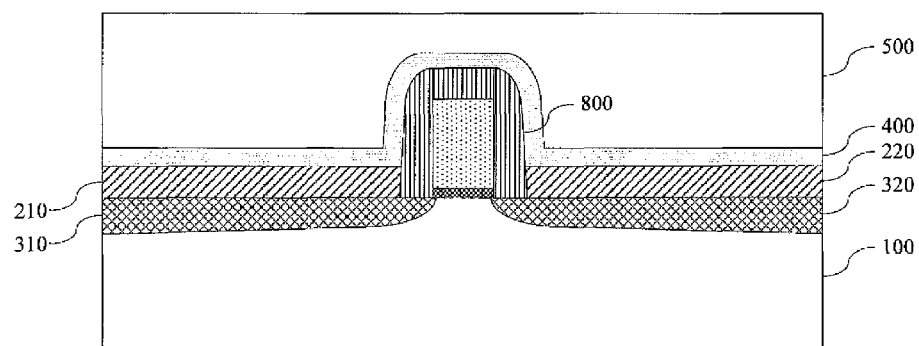

Next, according to conventional processes, the nitride layer 400 and the oxide layer 500 may be deposited conformally and sequentially on the structure illustrated in FIG. 2, and the oxide layer 500 may be planarized (which may use a process such as chemical mechanical planarization (CMP) etc.), as shown in FIG. 3. The oxide layer 500 and the nitride layer 400 may be replaced with other dielectric materials well known to the skilled in the art, which are not limited in the present invention.

Figure 4:
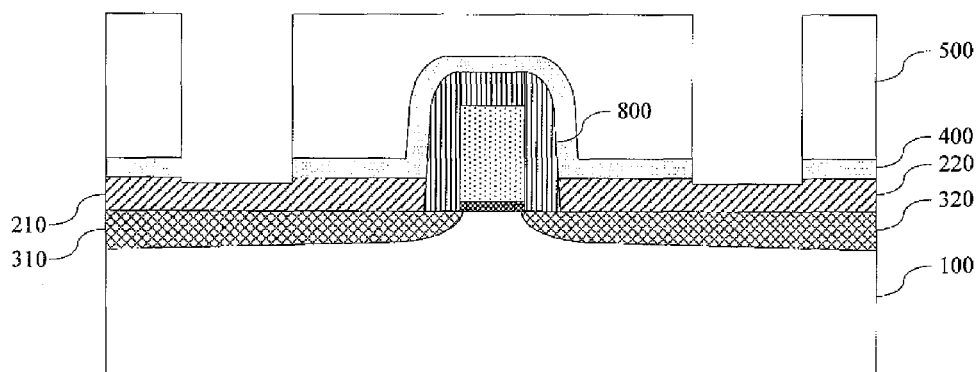

Then, the contact hole for accommodating the contact may be formed on the structure illustrated in FIG. 3 according to conventional processes, as shown in FIG. 4. The bottom of the contact hole exposes the source/the drain. For example, a conventional process such as photolithography may be used.

Figure 5:
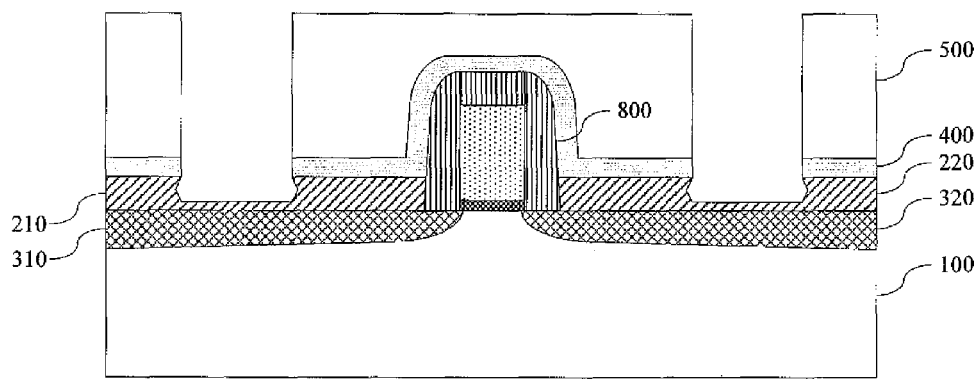

Next, a contact hole with an enlarged end may be formed as shown in FIG. 5. For example, an isotropic dry etching or wet etching may be used; or an anisotropic wet etching may be used, in which the sidewalls of the contact hole are in parallel with the crystal face (111) of the Si substrate. For example, KOH or TMAH solution may be used for the wet etch of the raised source layer 210 and the raised drain layer 220 which are exposed in the bottom of the contact hole in the structure of FIG. 4, so as to form the contact holes with enlarged bottoms (diamondoid cross sections).

Finally, the contact hole in FIG. 5 may be filled with contact metal according to conventional processes, so as to form the source contact 610/the drain contact 620, as shown in FIG. 6. The source contact 610/the drain contact 620 have a shape of contact hole. That is, the end of the source contact 610/the drain contact 620 which is in contact with the raised source layer 210/the raised drain layer 220 has an enlarged end (the enlarged end having a diamondoid cross section), which may increase contact area between the source contact 610/the drain contact 620 and the raised source layer 210/the raised drain layer 220 (the source/the drain).

In the present invention, since the source contact 610/the drain contact 620 have enlarged end in contact with the source/the drain, the contact area between the source contact 610/the drain contact 620 and the source/the drain can be increased, and the contact resistance can be reduced. Thus, the performances of the semiconductor device can be guaranteed/improved.

Second Embodiment

Figure 8:
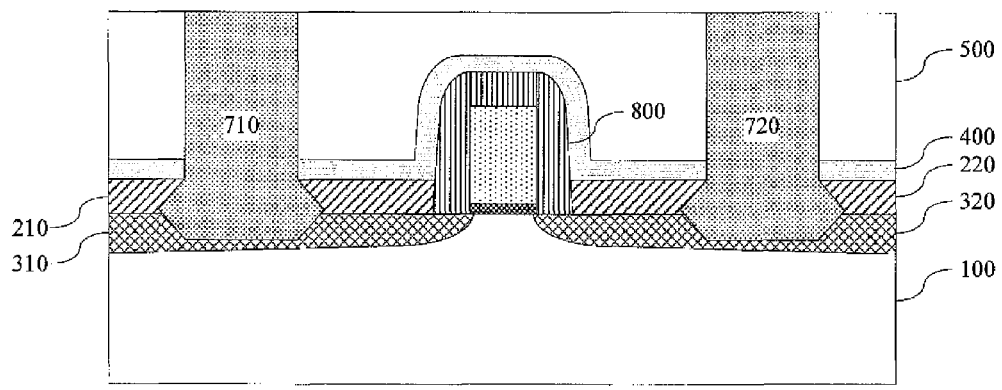

Firstly, a semiconductor device containing a contact fabricated by a method of fabricating a contact according to a second embodiment of the present invention may be described in detail with reference to FIG. 8. FIG. 8 shows an illustrative diagram of the semiconductor device containing the contact fabricated by the method of fabricating a contact according to the second embodiment of the present invention.

As shown in FIG. 8, the semiconductor device containing the contact fabricated by the method of fabricating a contact according to the first embodiment of the present invention may mainly comprise: a substrate 100 (Si wafer, SOI etc.); a gate 800 which is formed on the substrate 100; a source (S) and a drain (ID), which are located on opposite sides of the gate 800 respectively, wherein the source may include a source in-situ doped layer (n-type or p-type) 310 formed inside the substrate 100 and a raised source layer (n-type or p-type doped Si) 210 on the source in-situ doped layer 310, and the drain may include a drain in-situ doped layer (n-type or p-type) 320 formed inside the substrate 100 and a raised drain layer (n-type or p-type doped Si) 220 on the drain in-situ doped layer 320; a nitride layer 400, which may cover the gate 800, the source and the drain; an oxide layer 500, which may cover the nitride layer 400; a source contact 710, which may extend through the oxide layer 500, the nitride layer 400, and the raised source layer 220, and contact with the source in-situ doped layer 310 of the source; and a drain contact 720, which may extend through the oxide layer 500, the nitride layer 400 and the raised drain layer 220 contact with the drain in-situ doped layer 320 of the drain, wherein the source contact 710 and the drain contact 720 may have increased cross sections (i.e. diamondoid cross sections) on respective end parts of the source contact 710 and the drain contact 720 in the source (the raised source layer 210 and the source in-situ doped layer 310) and the drain (the raised drain layer 220 and the drain in-situ doped layer 320). In the above solution, the oxide layer 500 and the nitride layer 400 may also be replaced with other dielectric materials well-known to the skilled in the art, which are not limited in the present invention.

In the present invention, since the source contact 710/the drain contact 720 have enlarged cross section at the end in contact with the source/the drain, the contact area between the source contact 710/the drain contact 720 and the source/the drain can be increased, and the contact resistance can be reduced. Thus, the performances of the semiconductor device can be guaranteed/improved.

Additionally, the source contact 710/the drain contact 720 may be formed of the strain contact material. Thus, a tensile stress (for an n-type semiconductor device) or a compressive stress (for a p-type semiconductor device) can be applied to other surrounding structures (especially to the source in-situ doped layer 310/the drain in-situ doped layer 320), and the electron mobility (for the n-type semiconductor device) or the hole mobility (for the p-type semiconductor device) can be enhanced, so that the performances of the semiconductor device can be guaranteed/improved.

Hereinafter, the steps in the method of fabricating the contact according to the second embodiment of the present invention will be described in detail with reference to FIGS. 1-4, 7 and 8.

The steps in FIGS. 1-4 are identical with those in the method of fabricating the contact according to the first embodiment of the present invention. Thus, the detailed descriptions on FIGS. 1-4 are omitted for simplicity, for which one may refer to the descriptions in the first embodiment for details.

As shown in FIG. 4, the contact hole for accommodating the contact may be formed according to conventional processes. The bottom of the contact hole exposes the source/the drain.

Figure 7:
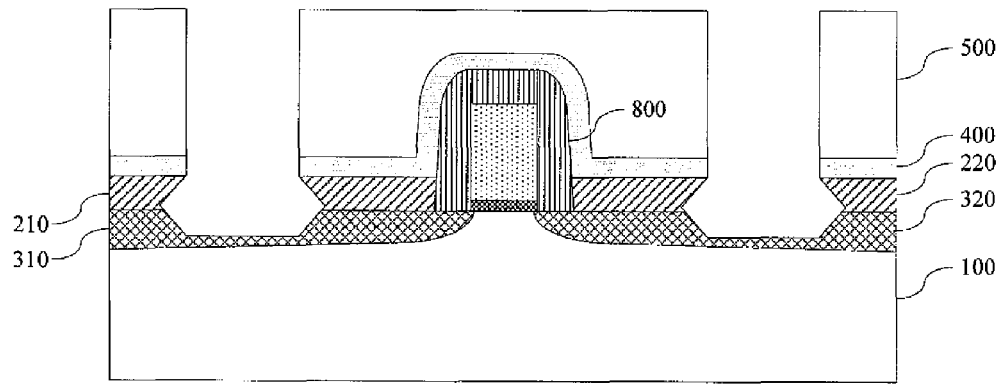

Next, a contact hole with an enlarged end may be formed as shown in FIG. 7. For example, an isotropic dry etching or wet etching may be used; or an anisotropic wet etching may be used, in which the sidewalls of the contact hole are in parallel with the crystal face (111) of the Si substrate. For example, KOH or TMAH solution may be used for the wet etch of the source/the drain which are exposed in the bottom of the contact hole in the structure of FIG. 4. In the first embodiment, the raised source layer 210 and the raised drain layer 220 are not penetrated by the etching (e.g. by controlling the concentration or temperature of the solution, or the etch time etc.). Different from the first embodiment, in the second embodiment, the raised source layer 210 and the raised drain layer 220 may be penetrated by the etching, and the source in-situ doped layer 310 and the drain in-situ doped layer 320 may be further etched, so as to form contact holes with enlarged bottoms (diamondoid cross sections). In the second embodiment, the bottoms of the contact holes can be larger than those in the first embodiment.

Finally, the contact hole in FIG. 7 may be filled with the metal according to conventional processes, so as to form the source contact 710/the drain contact 720, as shown in FIG. 8. The source contact 710/the drain contact 720 have a shape of contact hole. That is, the end of the source contact 710/the drain contact 720 which is in contact with the source (the raised source layer 210 and the source in-situ doped layer 310)/the drain (the raised drain layer 2200 and the drain in-situ doped layer 320) has an enlarged end (the enlarged end having a diamondoid cross section), which can increase the contact area between the source contact 710/the drain contact 720 and the source/the drain.

In the present invention, since the source contact 710/the drain contact 720 ha an enlarged end in contact with the source/the drain, the contact area between the source contact 710/the drain contact 720 and the source/the drain can be increased, and the contact resistance can be reduced. Thus, the performances of the semiconductor device can be guaranteed/improved.

Additionally, in the steps as shown in FIG. 8, strain contact metal may be filled to form the source contact 710/the drain contact 720. Thus, a tensile stress (for an n-type semiconductor device) or a compressive stress (for a p-type semiconductor device) can be applied to other surrounding structures (especially to the source in-situ doped layer 310/the drain in-situ doped layer 320) by controlling process parameters during the deposition and thus controlling the generation of the stress, and the electron mobility (for an n-type semiconductor device) or the hole mobility (for a p-type semiconductor device) can be enhanced, so that the performances of the semiconductor device can be guaranteed/improved.

The above is only preferred embodiments of the present invention and the present invention is not limited to the above embodiments. Therefore, any modifications, substitutions, and improvements to the present invention are possible without departing from the spirit and scope of the present invention.

What is claimed is:

1. A semiconductor device, comprising:
    a substrate;
    a gate, which is formed on the substrate;
    a source and a drain, which are located on opposite sides of the gate; and
    at least one contact, which contacts with the source and/or the drain,
    wherein the source includes a source in-situ doped layer formed inside the substrate and a raised source layer on the source in-situ doped layer,
    the drain includes a drain in-situ doped layer formed inside the substrate and a raised drain layer on the drain in-situ doped layer, and
    the at least one contact has an enlarged end which is in contact with the source and/or the drain, wherein the enlarged end of the at least one contact has a diamondoid cross section and the enlarged end of the at least one contact is located inside both the raised source layer and the source in-situ doped layer, and/or the enlarged end of the at least one contact is located inside both the raised drain layer and the drain in-situ doped layer.

2. The semiconductor device according to claim 1, wherein the at least one contact is formed with a strain contact material.

3. The semiconductor device according to claim 1, wherein the substrate is a Si substrate, the crystal orientation of the Si substrate's surface being <100>, the raised source layer and/or the raised drain layer being formed by epitaxial growth along the crystal orientation <100> of the Si substrate's surface, the enlarged end being formed by a wet etching.

4. The semiconductor device according to claim 1, wherein the substrate is a Si substrate, the crystal orientation of the Si substrate's surface being <100>, the raised source layer and/or the raised drain layer being formed by epitaxial growth along the crystal orientation <100> of the Si substrate's surface, a sidewall of the enlarged end being in parallel with the crystal face {111} of the Si substrate.

5. A method for fabricating at least one contact, comprising:
    forming at least one contact hole on a semiconductor device structure, the semiconductor device structure comprising a substrate, a gate, a source, and a drain, the bottom of the at least one contact hole exposing the source and/or the drain, wherein the source includes a source in-situ doped layer formed inside the substrate and a raised source layer on the source in-situ doped layer, and the drain includes a drain in-situ doped layer formed inside the substrate and a raised drain layer on the drain in-situ doped layer;
    etching the source in-situ doped layer and the raised source layer and/or the drain in-situ doped layer and the raised drain layer exposed at the bottom of the at least one contact hole, so as to form at least one contact hole having an enlarged bottom inside both the raised source layer and the source in-situ doped layer, and/or inside both the raised drain layer and the drain in-situ doped layer, wherein the enlarged bottom of the at least one contact has a diamondoid cross section; and
    filling the at least one contact hole having the enlarged bottom with a contact material to form at least one contact contacting with the source and/or the drain, so that the at least one contact has an enlarged end which is in contact with the source and/or the drain.

6. The method according to claim 5, wherein the contact material is a strain contact material.

7. The method according to claim 5, wherein the substrate is a Si substrate, the crystal orientation of the Si substrate's surface being <100>, the raised source layer and/or the raised drain layer being formed by epitaxial growth along the crystal orientation <100> of the Si substrate's surface, the enlarged end being formed by a wet etching.

8. The method according to claim 5, wherein the substrate is a Si substrate, the crystal orientation of the Si substrate's surface being <100>, the raised source layer and/or the raised drain layer being formed by epitaxial growth along the crystal orientation <100> of the Si substrate's surface, a sidewall of the enlarged end being in parallel with the crystal face {111} of the Si substrate.

\* \* \* \* \*